United States Patent
Foster et al.

(10) Patent No.: US 8,383,442 B2
(45) Date of Patent: Feb. 26, 2013

(54) METHODS FOR REDUCED STRESS ANCHORS

(75) Inventors: Michael Foster, Issaquah, WA (US);
Mark Williams, Seattle, WA (US);
Mark Eskridge, Renton, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/237,838

(22) Filed: Sep. 20, 2011

(65) Prior Publication Data
US 2012/0070931 A1  Mar. 22, 2012

Related U.S. Application Data

(62) Division of application No. 12/146,014, filed on Jun. 25, 2008, now Pat. No. 8,039,912.

(51) Int. Cl.
*H01L 21/00* (2006.01)

(52) U.S. Cl. .... 438/52; 438/117; 257/418; 257/E29.324
(58) Field of Classification Search .................. 438/52, 438/117; 257/418, E29.324
See application file for complete search history.

(56) References Cited

U.S. PATENT DOCUMENTS 6,100,477 A * 8/2000 Randall et al. ............... 200/181

* cited by examiner

*Primary Examiner* — Stephen W Smoot
*Assistant Examiner* — Vicki B Booker
(74) *Attorney, Agent, or Firm* — Lowe Graham Jones PLLC

(57) ABSTRACT

Methods of anchoring components of a Micro-Electro-Mechanical Systems (MEMS) device to a substrate. An exemplary embodiment has a trace anchor bonded to a substrate, a device anchor bonded to the substrate, and an anchor flexure configured to flexibly couple the trace anchor and the device anchor to substantially prevent transmission of a stress induced in the trace anchor from being transmitted to the device anchor.

5 Claims, 2 Drawing Sheets

US 8,383,442 B2

METHODS FOR REDUCED STRESS ANCHORS

RELATED APPLICATION

This application is a Divisional of U.S. patent application Ser. No. 12/146,014 filed Jun. 25, 2008, the contents of which are hereby incorporated by reference.

BACKGROUND OF THE INVENTION

Various silicon-based devices, such as a Micro-Electro-Mechanical Systems (MEMS) gyroscope, are mechanically coupled to a substrate. Coupling of the MEMS device to the substrate occurs at one or more anchor points (anchors) bonded to the substrate, referred to herein as mesas.

Portions of the MEMS device may be suspended from the substrate using one or more silicon flexures. A number of recesses etched into the substrate allow the portions of the MEMS device, referred to herein as a MEMS mechanism, to move freely within an interior portion of the MEMS device.

FIG. 1 is a top view 100 of a prior art anchor 102 bonded to a portion of a substrate 104. FIG. 2 is a side cut-away view 200 of the prior art anchor 102 bonded to the portion of a substrate 104. The anchor 102 is bonded to the substrate 104 on a mesa 106 along the contact region 108 where the anchor 102 and the substrate 104 are in contact.

The anchor 102 fixes and supports a MEMS mechanism 118 via an interconnecting flexure 110 or the like. Flexure 110 allows for movement of the MEMS mechanism 118 in selected directions and limits movement in other directions.

Prior to bonding the anchor 102 to the substrate 104, a trace 112 is formed from an external location to a location on the mesa 106. The trace 112 may be made of a metal and formed by a suitable process, such as metal sputtering over a mask oriented above the substrate 104.

An optional bump 114 (or bumple) is located at or near the end of the trace 112 to facilitate electrical coupling between the anchor 102 and the trace 112. If the trace 112 is made of metal, the bump 114 may be the same metal or another metal that is relatively soft and deformable under pressure and/or temperature.

Often, the process of bonding the anchor 102 to the substrate mesa 106 uses a pressure which deforms the trace 112 and/or the bump 114. Deformation of the trace 112 and/or the bump 114 improves the electrical connectivity between the anchor 102 and the trace 112.

During the process of bonding, stresses occur in the anchor 102. The stress is caused by forces exerted by the trace 112 and/or the bump 114 onto the material of the anchor 102. Such stresses (conceptually illustrated by a plurality of stress lines 116) exerted by the bump 114 to the anchor 102 may cause damage or otherwise stress the material of the anchor 102. Further, temperature fluctuations during use of the MEMS device may change the relative size of the trace 112 and/or the bump 114, inducing a time-varying change in the stress of the material of the anchor 102. Additional stress may be induced by a coefficient of thermal expansion mismatch between silicon and substrate material.

The stresses induced in the material of the anchor 102 are undesirable in that such stresses, in addition to forces transmitted from the flexure 110 to the anchor 102 during MEMS device use, may result in the formation of microcracks. Such microcracks may lead to structure failure of the MEMS device at the anchor 102.

Additionally, the movement of the MEMS mechanism 118 generates forces that are transmitted to the anchor 102 via the flexure 110. The stresses and/or microcracks may sufficiently weaken the anchor 102 such that the anchor 102 may structurally fail when the forces generated by movement of the MEMS mechanism 118 are transmitted to the anchor 102.

Accordingly, the anchor 102 is designed with sufficient size and mass to accommodate the stresses induced in the material of the anchor 102 from the trace 112 and/or the bump 114, and to accommodate forces generated by the MEMS mechanism 118. However, the prior art process has several disadvantages. The minimum size of the anchor 102 is limited since the anchor 102 must have sufficient material to accommodate the induced stresses. As MEMS devices become increasingly smaller, it is very desirable to reduce the size of anchors used in a MEMS device. Further, it is desirable to reduce fabrication process costs.

SUMMARY OF THE INVENTION

Systems and methods that anchor components of a Micro-Electro-Mechanical Systems (MEMS) device to a substrate are disclosed. An exemplary embodiment has a trace anchor bonded to a substrate, a device anchor bonded to the substrate, and an anchor flexure configured to flexibly couple the trace anchor and the device anchor to substantially prevent transmission of a stress induced in the trace anchor from being transmitted to the device anchor.

In accordance with further aspects, an exemplary embodiment bonds a trace anchor of the MEMS device to a trace anchor mesa of the substrate, wherein at least one of a trace and a bump induce a stress into the trace anchor; and bonds the device anchor to the device anchor mesa of the substrate. The device anchor is flexibly coupled to the trace anchor by an anchor flexure that substantially prevents transmission of the stresses induced in the trace anchor to the device anchor.

BRIEF DESCRIPTION OF THE DRAWINGS

Preferred and alternative embodiments are described in detail below with reference to the following drawings.

DETAILED DESCRIPTION OF THE PREFERRED EMBODIMENT

Figure 1:
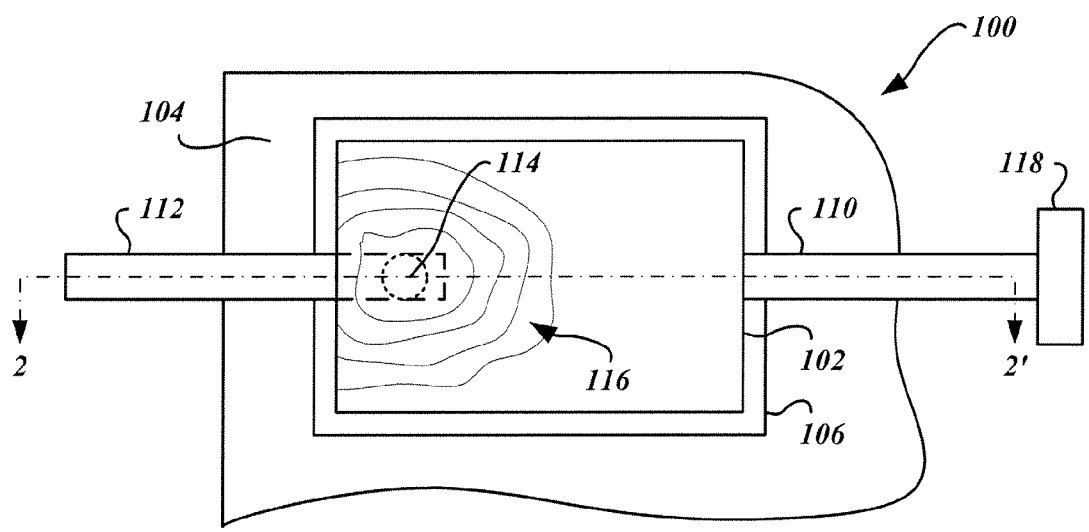
FIG. 1 is a top view of a prior art anchor bonded to a portion of a substrate.
Figure 2:
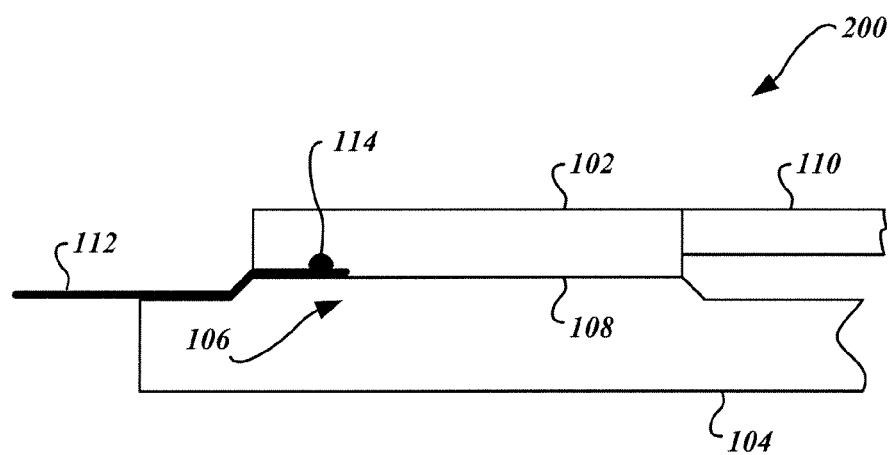
FIG. 2 is a side cut-away view of the prior art anchor bonded to the portion of the substrate of FIG. 1.
Figure 3:
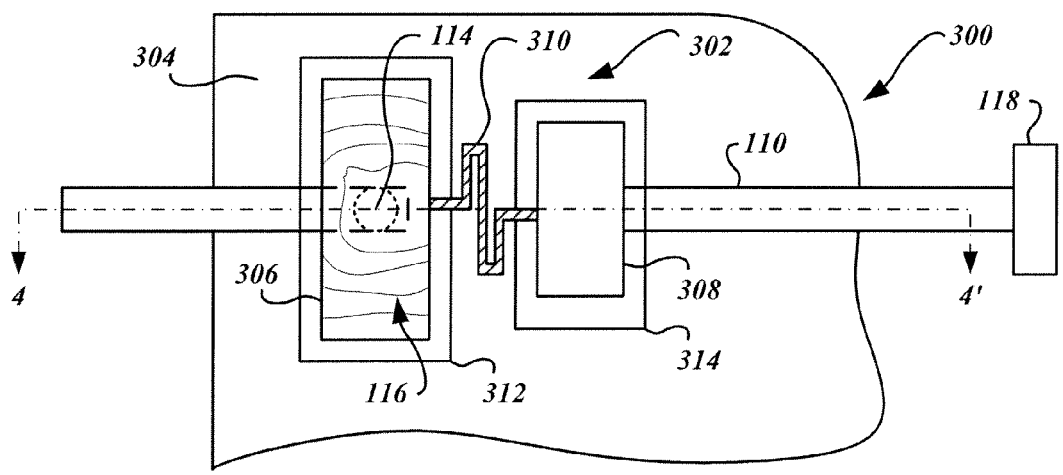
FIG. 3 is a top view of an embodiment of a dual anchor system bonded to a portion of a substrate embodiment.
Figure 4:
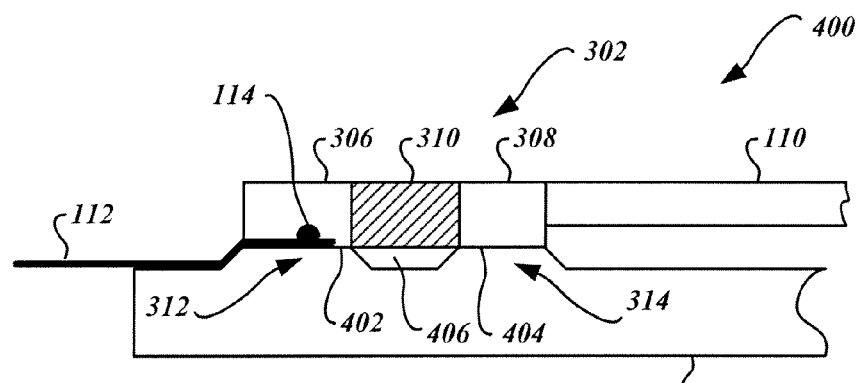
FIG. 4 is a side cut-away view of the dual anchor system bonded to the portion of the substrate of FIG. 3.

FIG. 3 is a top view 300 of an embodiment of a dual anchor system 302 bonded to a portion of a substrate 304. FIG. 4 is a side cut-away view 400 of the dual anchor system 302 bonded to the portion of the substrate 304. Embodiments of the dual anchor system 302 include a trace anchor 306, a device anchor 308, and an anchor flexure 310. In one embodiment, the substrate 304 includes a trace anchor mesa 312 and a device anchor mesa 314. The dual anchor system 302 corresponds to a portion of a Micro-Electro-Mechanical Systems (MEMS) device that is bonded to the substrate 304.

The trace anchor 306 is bonded to the trace anchor mesa 312 at a contact region 402. The device anchor 308 is bonded to the substrate 304 at a contact region 404. The anchor flexure 310 physically couples and electrically couples the trace anchor 306 and the device anchor 308. The anchor flexure 310 is flexible, and is not bonded to the substrate 304.

As noted above, the bonding process may apply a pressure which would deform the bump 114 to improve the electrical connectivity between the device anchor 308 and the trace 112. However, forces exerted by the trace 112 and/or the bump 114 to the trace anchor 306 cause stresses in the material of the trace anchor 306 (conceptually illustrated by the stress lines 116). Further, temperature fluctuations during use may change the relative size of the bump 114, further inducing time-varying changes in the stress in the trace anchor 306.

Since the anchor flexure 310 is not bonded in the location of the trace 112 and/or the bump 114, and since the anchor flexure 310 is flexible, stresses induced into the device anchor 308 are not significantly transmitted from the trace anchor 306, through the anchor flexure 310, into the device anchor 308. Accordingly, the device anchor 308 will be substantially free of the microcracks that might be otherwise formed by the stress from the bump 114. The anchor flexure 310 may have any suitable shape and/or amount of flexibility.

The device anchor 308 fixes and supports the MEMS mechanism 118 via the interconnecting flexure 110 or the like. The flexure 110 allows for movement of the MEMS mechanism 118 in selected directions and may prevent movement in other directions. Since stresses from the trace anchor 306 are not transmitted to the device anchor 308, the structural integrity of the device anchor 308 is maintained. That is, the absence of the stresses substantially reduces the presence, if any, of microcracks that would otherwise weaken the device anchor 308. Accordingly, stresses generated by the flexure 110 will not cause failure at the device anchor 308.

Furthermore, stresses transmitted from the flexure 110 onto the device anchor 308 are not transmitted to the trace anchor 306 in view of the flexible anchor flexure 310. Accordingly, even if the stresses and/or microcracks in the trace anchor 306 exist, the stresses generated by the anchor flexure 110 from movement of the MEMS mechanism 118 will not cause failure at the trace anchor 306 (since they are not substantially transmitted past the anchor flexure 110).

Prior to the bonding process wherein the trace anchor 306 is bonded to the trace anchor mesa 312, and the device anchor 308 is bonded to the device anchor mesa 314, the trace anchor mesa 312 and the device anchor mesa 314 are formed on the substrate 304. The mesas 312 and 314 may be formed using any suitable process, such as, but not limited to, etching or micromachining Accordingly, a void region 406 is formed between the mesas 312 and 314 such that during bonding, the anchor flexure 310 is not bonded to the substrate 304. Accordingly, the anchor flexure 310 is free to flex as needed to prevent transmission of stresses from the trace anchor 306 to the device anchor 308, and vice versa.

Figure 5:
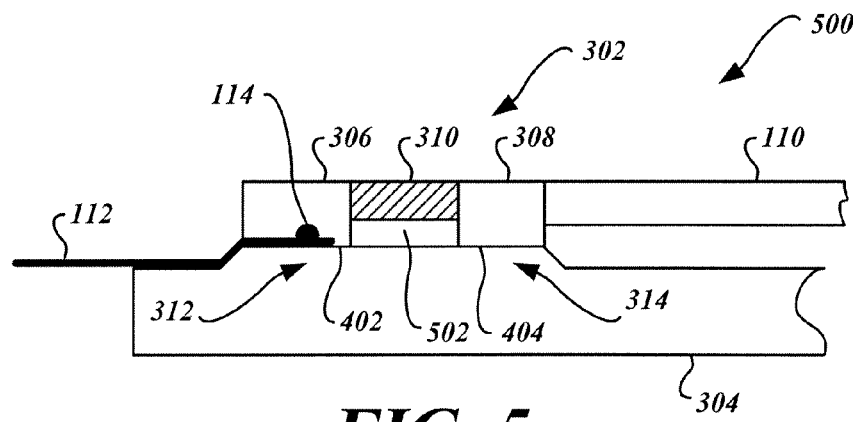
FIG. 5 is a side cut-away view of an alternative embodiment of the dual anchor system.

FIG. 5 is a side cut-away view 500 of an alternative embodiment of the dual anchor system 302. In this alternative embodiment, a lower portion of the anchor flexure 310 has been removed so that a void region 502 is formed between the substrate 304 and the anchor flexure 310. Accordingly, the anchor flexure 310 is not bonded to the substrate 304 and the anchor flexure 310 is free to flex as needed to prevent transmission of stresses from the trace anchor 306 to the device anchor 308, and vice versa. The region 502 may be formed using any suitable etching or micromachining process.

In the embodiment illustrated in FIG. 5, the trace anchor mesa 312 and the device anchor mesa 314 are formed as a single mesa. Alternatively, the trace anchor mesa 312 and the device anchor mesa 314 may not be raised above the surface of the substrate 304. Rather, components of the MEMS device are under etched or machined so that they are free to move. These regions 312 and 314 where the bonding occurs, corresponding to the trace anchor mesa 312 and the device anchor mesa 314, are defined as mesas for convenience.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method of anchoring a Micro-Electro-Mechanical Systems (MEMS) device to a substrate, the method comprising:
   bonding a trace anchor of the MEMS device to a trace anchor mesa of the substrate, wherein at least a trace induces a stress into the trace anchor;
   bonding a device anchor of the MEMS device to a device anchor mesa of the substrate;
   flexibly coupling the device anchor to the trace anchor by an anchor flexure that substantially prevents transmission of the stress induced in the trace anchor to the device anchor;
   forming a void between the anchor flexure and the substrate; and
   forming the trace anchor mesa and the device anchor mesa on the substrate so as to form the void region in the substrate adjacent to a location of the anchor flexure, wherein the anchor flexure is not bonded to the substrate.

2. The method of claim 1, wherein forming a void region is performed prior to either bonding step, wherein the anchor flexure is not bonded to the substrate.

3. The method of claim 1, wherein the anchor flexure electrically couples the trace anchor and the device anchor.

4. The method of claim 1, wherein bonding the trace anchor to the trace anchor mesa comprises:
   applying a bump on the trace, wherein the bump is disposed between the trace and the trace anchor, and wherein the bump further induces additional stress into the trace anchor in response to a bonding of the trace anchor to the trace anchor mesa.

5. A method of anchoring a Micro-Electro-Mechanical Systems (MEMS) device to a substrate, the method comprising:
   bonding a trace anchor of the MEMS device to a trace anchor mesa of the substrate, wherein at least a trace induces a stress into the trace anchor;
   bonding a device anchor of the MEMS device to a device anchor mesa of the substrate;
   flexibly coupling the device anchor to the trace anchor by an anchor flexure that substantially prevents transmission of the stress induced in the trace anchor to the device anchor; and
   forming a void between the anchor flexure and the substrate, wherein forming a void region is performed prior to either bonding step, wherein the anchor flexure is not bonded to the substrate.

* * * * *